(12) United States Patent
Dearth et al.

(10) Patent No.: US 6,345,242 B1
(45) Date of Patent: Feb. 5, 2002

(54) SYNCHRONIZATION MECHANISM FOR DISTRIBUTED HARDWARE SIMULATION

(75) Inventors: Glenn A. Dearth, Groton; Paul M. Whittemore, Marlborough, both of MA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/639,389

(22) Filed: Aug. 15, 2000

Related U.S. Application Data

(62) Division of application No. 09/221,670, filed on Dec. 23, 1998, now Pat. No. 6,117,181, which is a continuation of application No. 08/621,816, filed on Mar. 22, 1996, now abandoned.

(51) Int. Cl.[7] ................................................ G06F 9/45
(52) U.S. Cl. .................... 703/22; 709/107; 709/200; 709/310
(58) Field of Search ........................ 703/1, 3, 13–22; 709/107, 108, 200, 310

(56) References Cited

U.S. PATENT DOCUMENTS

| 4,456,994 A | 6/1984 | Segarra | 714/33 |
| 5,339,435 A | 8/1994 | Lubkin et al. | 717/11 |

(List continued on next page.)

OTHER PUBLICATIONS

Pancake, "Multithreaded Languages for Scientific and Technical Computing", Proceedings of the IEEE, vol. 81 No. 2, pp. 288–304 (Feb. 1993).*

(List continued on next page.)

*Primary Examiner*—Kevin J. Teska
*Assistant Examiner*—Samuel Broda
(74) *Attorney, Agent, or Firm*—Conley, Rose & Tayon, PC; B. Noël Kivlin

(57) ABSTRACT

The synchronization state of each of a number of concurrently executing tests which interacts with a particular circuit simulation of one or more circuit simulations which collective simulate a circuit is represented and controlled by a respective local synchronization thread ("LST") of a hub through which each test interacts with each circuit simulation. When in a synchronization state in which a test is permitted to interact with a particular circuit simulation, the LST corresponding to the test prevents the circuit simulation from advancing simulated time by acquisition by the LST of a hold lock on the circuit simulation. The LST releases the hold lock when the synchronization state of the test is a state in which the test cannot interact with the circuit simulation. Each test is permitted to interact with the circuit simulation in a particular state. When each test completes interaction with the circuit simulation, each test enters a barrier mechanism. The barrier mechanism is used to ensure that all tests which are to request reservations of devices of the circuit simulation have requested from the hub such reservations before any test proceeds. In this way, the hub can establish the order in which such requests are granted in a repeatable manner. As each test enters the barrier mechanism, execution of the test is suspended and a reference to the test is added to a thread list. When all tests which are to enter the barrier have done so, each thread identified by a reference on the thread list is awakened and execution of the test resumes.

15 Claims, 8 Drawing Sheets

U.S. PATENT DOCUMENTS

| | | | |
|---|---|---|---|
| 5,442,772 A | | 8/1995 | Childs et al. .................. 703/13 |
| 5,519,848 A | | 5/1996 | Wloka et al. .................. 703/13 |
| 5,625,580 A | | 4/1997 | Read et al. .................... 703/21 |
| 5,634,010 A | | 5/1997 | Ciscon et al. ............... 709/223 |
| 5,715,184 A | * | 2/1998 | Tyler et al. .................... 703/15 |
| 5,794,005 A | * | 8/1998 | Steinman ...................... 703/17 |

OTHER PUBLICATIONS

Gibbs, "Making Sense of Collaborative Computing", Network World, vol. 11 Issue 2 pp. 23, 25–26 (Jan. 10, 1994).*

Bailey et al, "Parallel Logic Simulation of VLSI Systems", ACM Computing Surveys, vol. 26 No. 3, pp. 255–294 (Sep. 1994).*

Prasad, "Weaving a Thread: Solaris and Windows NT Both Support Powerful Multithreading/Multiprocessing to Help Get the Job Done Faster", Byte, pp. 173–174 (Oct. 1995).*

Pancake, "Multithreaded Languages for Scientific and Technical Computing", Proceedings of the IEEE, vol. 81 No. 2, pp. 288–304 (Feb. 1993).*

Northrup, "It's a Multithreaded World, Part 1", Byte, pp. 289–298 (May 1992).*

Northrup, "Multithreaded World, Part2", Byte, pp. 351–356 (Jun. 1992).*

Maliniak, "Multiprocessing Verilog Simulator Exploits the Parallel Nature of HDLs", Electronic Design, vol. 42 pp. 41–42 (Abstract only)(May 30, 1994).*

* cited by examiner

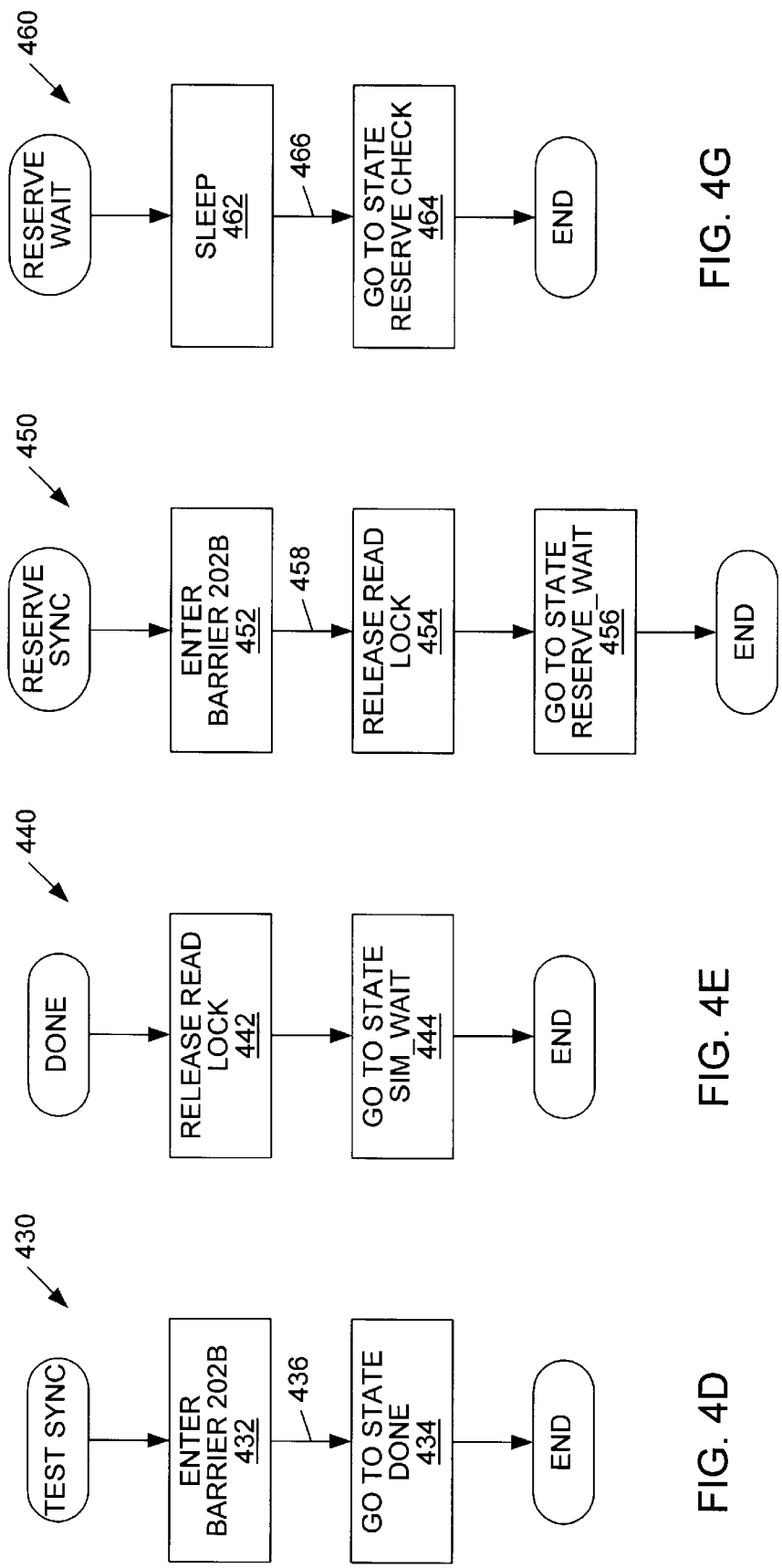

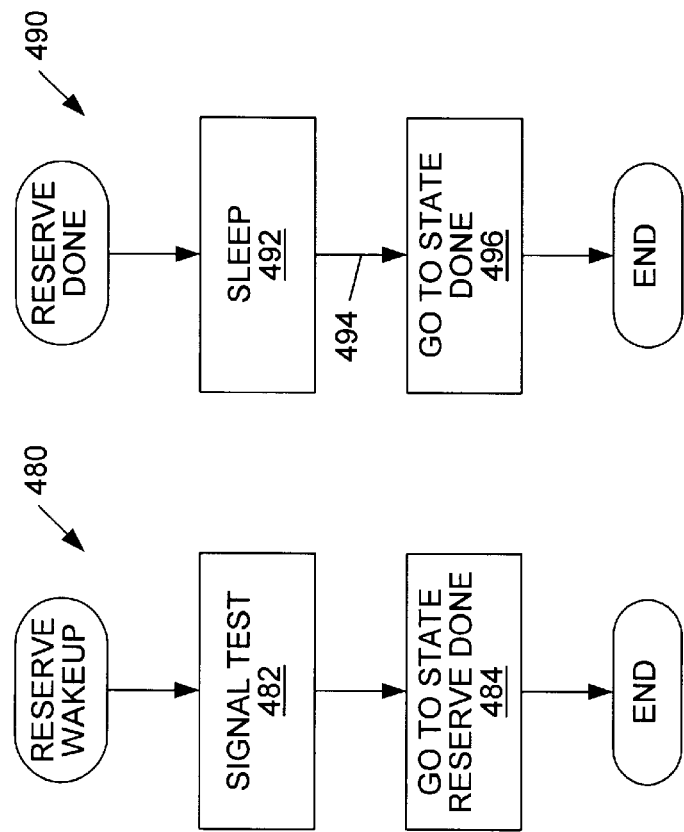
FIG. 4J
FIG. 4I
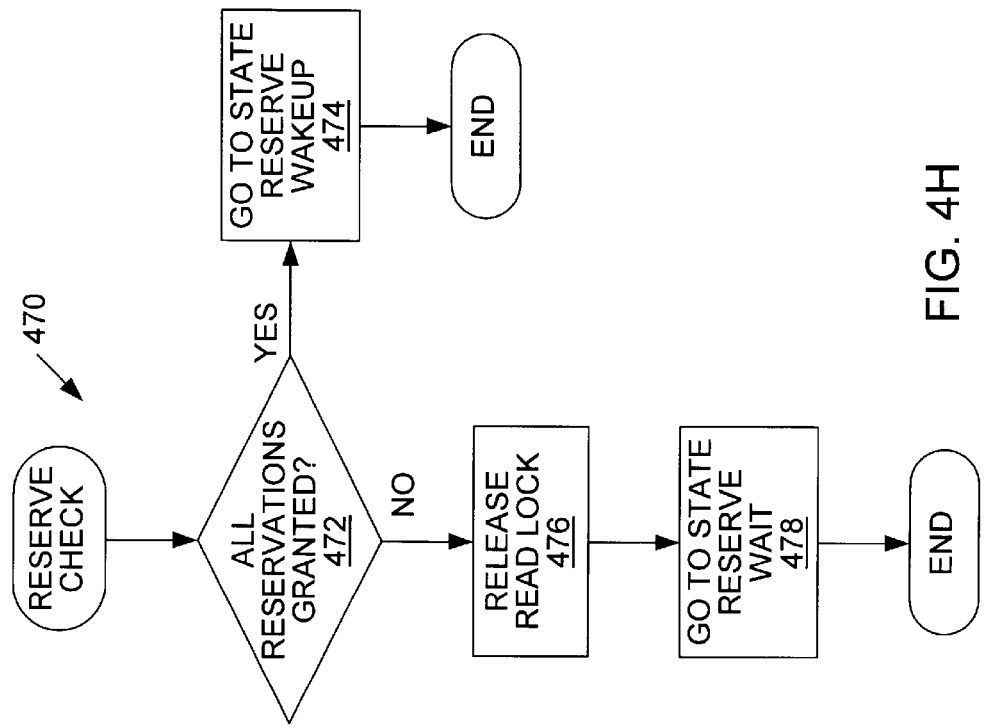
FIG. 4H

SYNCHRONIZATION MECHANISM FOR DISTRIBUTED HARDWARE SIMULATION

CROSS-REFERENCE TO RELATED APPLICATIONS

This application is a divisional application of U.S. patent application Ser. No. 09/221,670, entitled "Synchronization Mechanism for Distributed Hardware Simulation," filed Dec. 23, 1998 now U.S. Pat. No. 6,117,181, which is a continuation of U.S. patent application Ser. No. 08/621,816, filed Mar. 22, 1996 now abandoned.

The following copending U.S. Patent Applications are related to the present disclosure and the disclosures thereof are incorporated herein by reference: (i) U.S. patent application Ser. No. 08/628,439 for "Interface for Interfacing Simulation Tests Written in a High-Level Programming Language to a Simulation Model" by Glenn A. Dearth, Paul M. Whittemore, David A. Medeiros, George R. Plouffe, Jr., and Bennet H. Ih filed on Mar. 21, 1996, now U.S. Pat. No. 5,732,247 issued Mar. 24, 1998 (hereinafter the "Interface Application"), (ii) U.S. patent application Ser. No. 08/621,775 for "Virtual Bus for Distributed Hardware Simulation" by Glenn A. Dearth and Paul M. Whittemore filed on Mar. 21, 1996, now U.S. Pat. No. 5,881,267 issued Mar. 9, 1999 (hereinafter the "Virtual Bus Application"), (iii) U.S. patent application Ser. No. 08/621,777 for "Deadlock Avoidance Mechanism for Virtual Bus Distributed Hardware Simulation" by Glenn A. Dearth filed on Mar. 21, 1996, now U.S. Pat. No. 5,907,695 issued May 25, 1999 (hereinafter the "Deadlock Avoidance Application"), (iv) U.S. patent application Ser. No. 08/621,776 for "Object-Oriented Development Framework for Distributed Hardware Simulation" by Bennet H. Ih and Glenn A. Dearth filed on Mar. 21, 1996, now U.S. Pat. No. 5,848,236 issued Dec. 8, 1998 (hereinafter the "Framework Application"), and (v) U.S. patent application Ser. No. 08/621,818 for "Device Reservation Mechanism for Distributed Hardware Simulation" by Paul M. Whittemore and Glenn A Dearth filed on Mar. 21, 1996, now U.S. Pat. No. 5,812,814 issued Sep. 22, 1998 (hereinafter the "Reservation Application").

FIELD OF THE INVENTION

The present invention relates to computer simulation of electronic circuitry and, in particular, to a method and apparatus for synchronizing multiple, concurrently executing tests of a simulation of complex circuitry.

BACKGROUND OF THE INVENTION

In designing complex circuitry such as application-specific integrated circuits ("ASICs") or circuitry which includes several ASICs, the designed logic of such circuitry is typically simulated in a computer using data and computer programs to thereby test the viability and accurate performance of the designed logic. By doing so, design flaws can be detected prior to expending the engineering and financial resources and time required to physically build the circuitry. To simulate circuitry using data and computer programs, the circuitry is described in a hardware description language ("HDL") to form a model. One example of an HDL is the Verilog HDL processed by the Cadence Verilog hardware simulator available from Cadence Design Systems, Inc. of San Jose, Calif. The HDL model of a circuit typically includes a description of components of the state of the circuit and a description of the behavior of the circuit. The behavior of the circuit generally includes inter-relationships between various components of the state of the circuit.

A hardware simulator then uses the HDL model of the circuitry to simulate the circuitry. The hardware simulator is a computer process which accepts data defining simulated signals to be placed on certain parts of the simulated circuit and then changes the state of the circuit in accordance with the simulated signals. The certain parts of the circuit include, for example, terminals, lines, or registers of the simulated circuit.

Circuitry which is simulated in this manner is becoming increasingly complex; therefore, simulation of such circuitry on a single computer processor is becoming less feasible. Specifically, simulations of particularly complex circuits require intolerable amounts of time and computer resources to execute. The Interface Application describes a mechanism by which a complex circuit is divided into multiple circuit parts and by which the circuit parts are simulated by individual simulation models which can execute on multiple constituent computers of a computer network.

In addition, the mechanism described in the Interface Application permits multiple tests of the simulated circuit to execute concurrently. A test of a simulated circuit is a series of computer instructions and data which collectively define simulated signals to be placed at particular locations within the simulated circuit and simulated signals to be sampled at other particular locations within the simulated circuit. For example, a test can include computer instructions which direct (i) that a specific simulated signal is stored within a specific register of the simulated circuit, (ii) that the circuit is simulated for a number of cycles of a simulated clock signal, and (iii) that a resulting simulated signal is retrieved from a second register of the simulated circuit.

It is important that a simulation of a circuit has a quality which is generally known as repeatability. Repeatability of a test or of a combination of tests refers to consistency in the results of such tests in multiple executions of such test or combination of tests without changes in the design of the simulated circuit or the simulated signals to be applied to the simulated circuit. Without repeatability, tracking the execution of the one or more tests and the various circuit parts of the simulated circuit to analyze the tests and/or the simulated circuit to detect design errors becomes extremely difficult and complex.

When simulating a circuit according to multiple, concurrently executing tests, it is possible that the particular order in which transactions between the tests and the simulated circuit are initiated vary from one execution of the simulation of the circuit to another execution. Such is possible since the multiple tests execute concurrently and can execute on different computers of a computer network. Thus, whether a first of the tests or a second of the tests initiates a transaction with the simulated circuit before the other can vary from simulation to simulation and can depend, for example, on the relative processing speeds of the respective computers within which the first and second tests execute. As used herein, a transaction is an operation in which data representing simulated signals are written to or read from a particular component of the state of the simulated circuit. Examples of transactions include simulating data writes and/or reads to registers of the simulated circuit and driving simulated signals on or sampling simulated signals from a bus of the simulated circuit.

Thus, to ensure repeatability, the order in which transactions are initiated must be consistent from one simulation of the simulated circuit to another. What is therefore needed is a mechanism by which transactions between multiple, concurrently executing tests and a simulated circuit are synchronized.

SUMMARY OF THE INVENTION

In accordance with the present invention, the synchronization state of each test which interacts with a circuit simulation is represented and controlled by a respective local synchronization thread ("LST") of a hub through which each test interacts with each circuit simulation. When in a synchronization state in which a test is permitted to interact with a particular circuit simulation, the LST corresponding to the test prevents the circuit simulation from advancing simulated time by acquisition by the LST of a hold lock on the circuit simulation. The LST releases the hold lock when the synchronization state of the test is a state in which the test cannot interact with the circuit simulation.

Each test is permitted to interact with the circuit simulation in a particular state. When each test completes interaction with the circuit simulation, each test enters a barrier mechanism. The barrier mechanism is used to ensure that all tests which are to request reservations of devices of the circuit simulation have requested from the hub such reservations before any test proceeds. In this way, the hub can establish the order in which such requests are granted in a repeatable manner as described more completely in the Reservation Application. As each test enters the barrier mechanism, execution of the test is suspended and a reference to the test is added to a thread list. When all tests which are to enter the barrier have done so, each thread identified by a reference on the thread list is awakened and execution of the test resumes. Thus, in accordance with the present invention, repeatability of each simulation is ensured.

BRIEF DESCRIPTION OF THE DRAWINGS

FIGS. 4A–J are logic flow diagrams illustrating the processing of local synchronization threads at respective states of FIG. 3.

DETAILED DESCRIPTION

In accordance with the present invention, each test, e.g., each of tests 120A–C (FIG. 1), which is to carry out transactions with a simulated circuit, e.g., a circuit simulated by simulation systems 140A–C collectively, through a hub 130 is associated with a respective local synchronization thread ("LST") of hub 130. Each LST acts as a synchronization agent for a respective test and represents the synchronization state of the respective test.

Hardware Operating Environment

Figure 1:
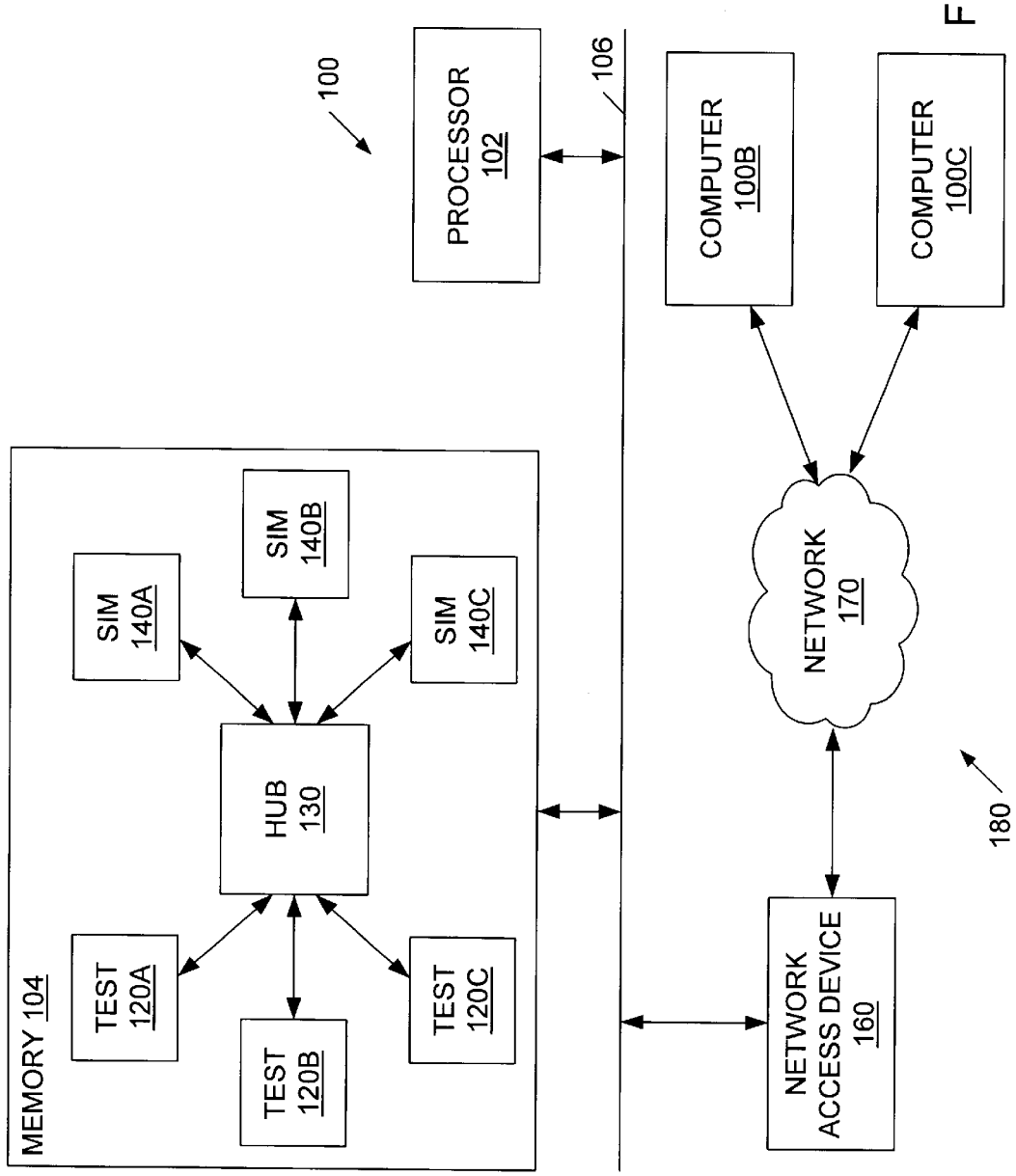
FIG. 1 is a block diagram of a simulation in which execution of multiple tests and multiple simulation systems are synchronized in accordance with the present invention.

To facilitate an appreciation of the present invention, the operating environment of the described embodiment is described briefly. FIG. 1 shows computers 100, 100B, and 100C connected to one another through a network 170 to form a computer network 180. Each of computers 100, 100B, and 100C are directly analogous to one another, and the following description of computer 100 is therefore equally applicable to computers 100B–C, except as otherwise noted.

Computer 100 includes a processor 102 which fetches computer instructions from a memory 104 through a bus 106 and executes those computer instructions. In executing computer instructions fetched from memory 104, processor 102 can retrieve data from or write data to memory 104, display information on one or more computer display devices (not shown), receive command signals from one or more user-input devices (not shown), or transfer data to computer 100B or computer 100C through network 170. Processor 102 can be, for example, any of the SPARC processors available from Sun Microsystems, Inc. of Mountain View, Calif. Memory 104 can include any type of computer memory including, without limitation, randomly accessible memory (RAM), read-only memory (ROM), and storage devices which include magnetic and optical storage media such as magnetic or optical disks. Computer 100 can be, for example, any of the SPARCstation workstation computer systems available from Sun Microsystems, Inc. of Mountain View, Calif.

Computer 100 also includes a network access device 160, through which computer 100 is coupled to network 170. Network access device 160, in accordance with control signals received from processor 102, cooperates with a network access device (not shown) of computer 100B or computer 100C to transfer data through network 170. The transfer of data between network access devices of computers 100, 100B, and 100C is conventional and well-known. Network access device 160 can be generally any circuitry which is used to transfer data between a computer and network such as computer 100 and network 170 and can be, for example, an Ethernet controller chip or a modem.

Sun, Sun Microsystems, and the Sun Logo are trademarks or registered trademarks of Sun Microsystems, Inc. in the United States and other countries. All SPARC trademarks are used under license and are trademarks of SPARC International, Inc. in the United States and other countries. Products bearing SPARC trademarks are based upon an architecture developed by Sun Microsystems, Inc.

Synchronization of the Simulation

Tests 120A–C, hub 130, and simulation systems 140A–C are computer processes executing in processor 102 from memory 104. Tests 120A–C and simulation systems 140A–C are described more completely in the Interface Application and that description is incorporated herein in its entirety by reference. Through hub 130, each of a number of tests interacts with any of a number of simulation systems to simulate multiple, concurrent transactions with a simulated circuit. The number of tests includes tests 120A–C and other tests which are directly analogous to tests 120A–C which execute within any of computers 100 and 100B–C. Similarly, the number of simulation systems includes simulation systems 140A–C and other simulation systems which are directly analogous to simulation systems 140A–C which execute within any of computers 100 and 100B–C. Only one hub can control transactions between the tests and simulation systems; therefore, no hubs which are analogous to hub 130 execute within either of computers 100B–C. While hub 130 is shown in FIG. 1 to be executing in a computer in which a number of tests and simulation systems execute, it should be noted that each of the processes shown to be executing in computer 100 can be distributed to other computers of computer network 180. For example, hub 130 can execute in a computer of computer network 180 in which no tests or simulation systems execute. Similarly, a test can execute in a computer in which neither hub 130 nor any simulation systems execute, and a simulation system can execute in a computer in which neither hub 130 nor any test execute.

Figure 2:
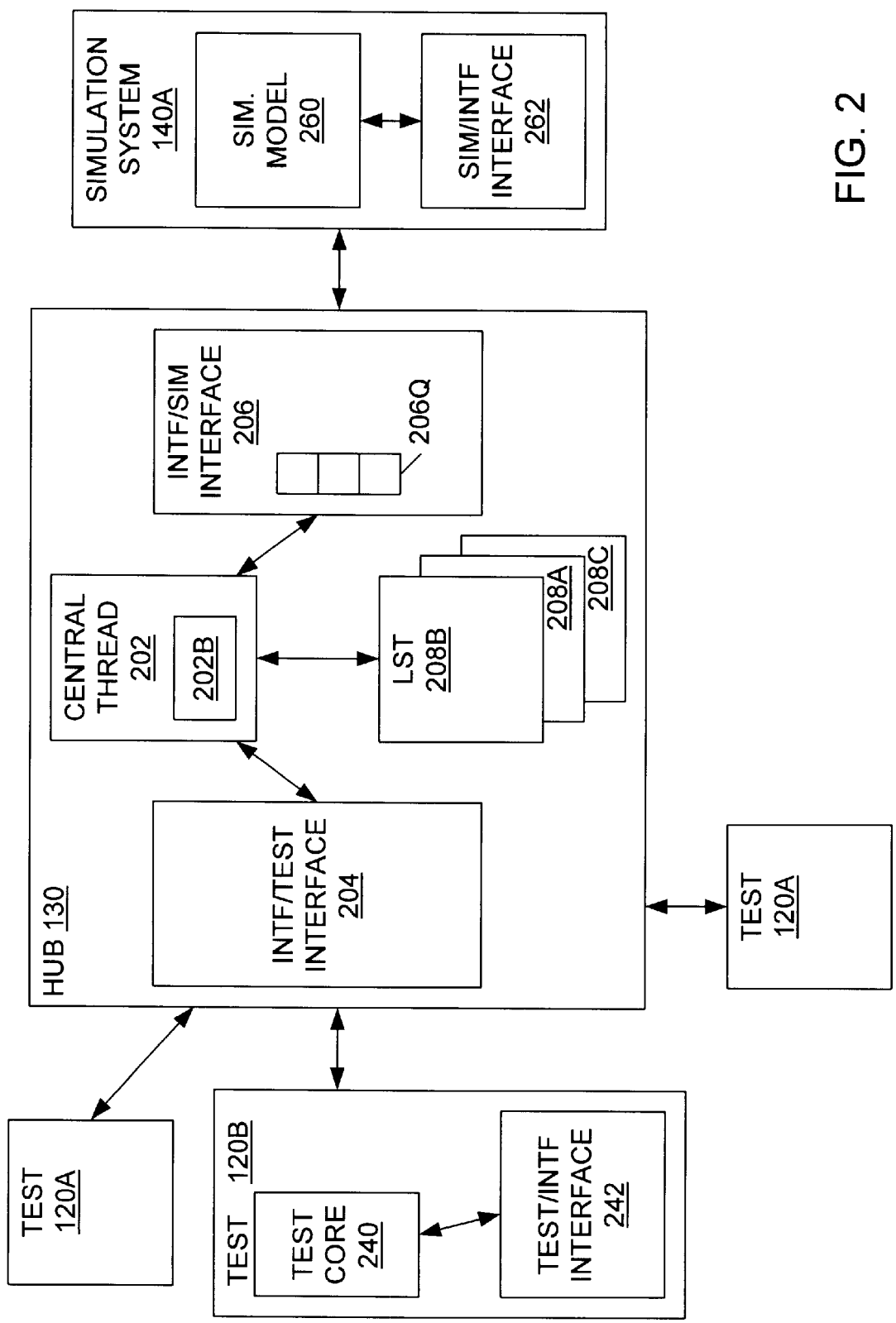
FIG. 2 is block diagram of the multiple tests and multiple simulation systems and a hub including local synchronization threads in accordance with the present invention.

Hub 130, test 120B, and simulation system 140A are shown in greater detail in FIG. 2. Tests 120A–C are directly analogous to one another. Accordingly, the following description of test 120B is equally applicable to tests 120A and 120C. Similarly, simulation systems 140A–C are directly analogous to one another. Accordingly, the following description of simulation system 140A is equally applicable to simulation systems 140B and 140C. Each of hub 130, test 120B, and simulation system 140A are multi-threaded. Computer programs, computer processes, and multi-threaded computer processes are well-known but are described here briefly for completeness.

A computer program is a series of computer instructions and data which, when executed within a computer system, perform a task. Execution of a computer program is a computer process, and the computer program defines the computer process. A single computer program can be executed any number of times, and each execution is a different computer process. Most computer systems in use today permit several computer processes to execute concurrently within a computer system. In addition to the computer instructions and data of a defining computer program, a computer process includes data specifying an execution state of the computer process, including information identifying the computer instruction which is currently being executed, the computer instruction which is to be executed next, and a stack which is used to save previous computer process states for later restoration.

In some computers, a computer process can create new execution states which are sometimes called "threads," which are independent of the execution state of the computer process, and which execute concurrently with one another and with the computer process within the computer system. Each thread which executes concurrently is independently scheduled for execution. Such a computer process having multiple threads is generally called a "multi-threaded" computer process and each thread is sometimes referred to as a "light-weight process." Each thread of a computer process executes in the context of the computer process. In particular, each thread shares the address space of the computer process and resources are allocated to a computer process, and therefore all threads of the computer process, rather than an individual thread.

Hub 130 includes a central thread 202 which is the primary thread of hub 130 and which includes a barrier structure 202B, which is described more completely below. Hub 130 includes an interface/test interface 204 and an interface/simulation interface 206, both of which are described more completely in the Interface Application, and that description is incorporated herein by reference. Briefly, interface/test interface 204 is a remote procedure calling ("RPC") server thread of hub 130 which regulates communication between multiple concurrently executing tests, e.g., tests 120A–C, and simulation systems such as simulation system 140A in response to signals received from such tests. Interface/simulation interface 206 is a remote procedure calling ("RPC") server thread of hub 130 which regulates communication between multiple concurrently executing tests and simulation systems such as simulation system 140A in response to signals received from such simulation systems. In one embodiment, interface/test interface 204 and interface/simulation interface 206 are identical with the exception that interface/test interface 204 processes commands received from tests such as tests 120A–C and interface/simulation interface 206 processes commands received from simulation systems such as simulation system 140A.

Test 120B includes a user thread 240 and a test/interface interface 242. Test/interface interface 242 is described more completely in the Interface Application, and that description is incorporated herein by reference. Briefly, test/Interface interface 242 is a thread of test 120B which implements the RPC protocol by which test 120B interacts with hub 130 through interface/test interface 204. User thread 240 of test 120B is a thread which is designed and implemented by a test design engineer and which defines the behavior of test 120B and therefore the transactions of test 120B with simulation systems such as simulation system 140A. As described more completely below, execution of user thread 240 is suspended substantially immediately after registration of test 120B and again periodically. Since test/interface interface 242 is a separate thread of test 120B, execution of user thread 240 can remain suspended while test/interface interface 242 continues to execute and process signals received from hub 130 as described more completely below. Accordingly, a test design engineer configuring and implementing user thread 240 of test 120B is not required to configure user thread 240 to resume execution every time a signal is received from hub 130. As a result, the task of the test design engineer in configuring user thread 240 is significantly simplified.

Simulation system 140A includes a simulation model 260 and a simulation/interface interface 262. Simulation model 260 and simulation/interface interface 262 are described more completely in the Interface Application, and that description is incorporated herein by reference. Briefly, simulation model 260 specifies in HDL a portion of the simulated circuit, and simulation/interface interface 262 of simulation system 140A implements the RPC protocol by which simulation system 140A interacts with hub 130 through interface/simulation interface 206.

Upon registration of test 120B, a local synchronization thread, e.g., local synchronization thread ("LST") 208B, which represents and controls the synchronization state of test 120B is created within hub 130. Registration of a test such as test 120B is described more completely in the Interface Application and that description is incorporated herein by reference. LST 208B implements a state machine on behalf of test 120B to represent and control the state of test 120B. By representing the state of test 120B, and the respective states of all other tests in a directly analogous manner, within hub 130, hub 130 can coordinate synchronization of the tests in a manner described more completely below. Moreover, since the state of test 120B is represented by a thread which represents and controls the state of test 120B only, the behavior of test 120B can be easily isolated for analysis and error detection using a conventional debugger. If hub 130 were to maintain state information for all tests in a single data structure, tracing through the database the state of a single test, e.g., test 120B, during a simulation involving multiple, concurrently executing tests would require significant effort and resources.

Figure 3:
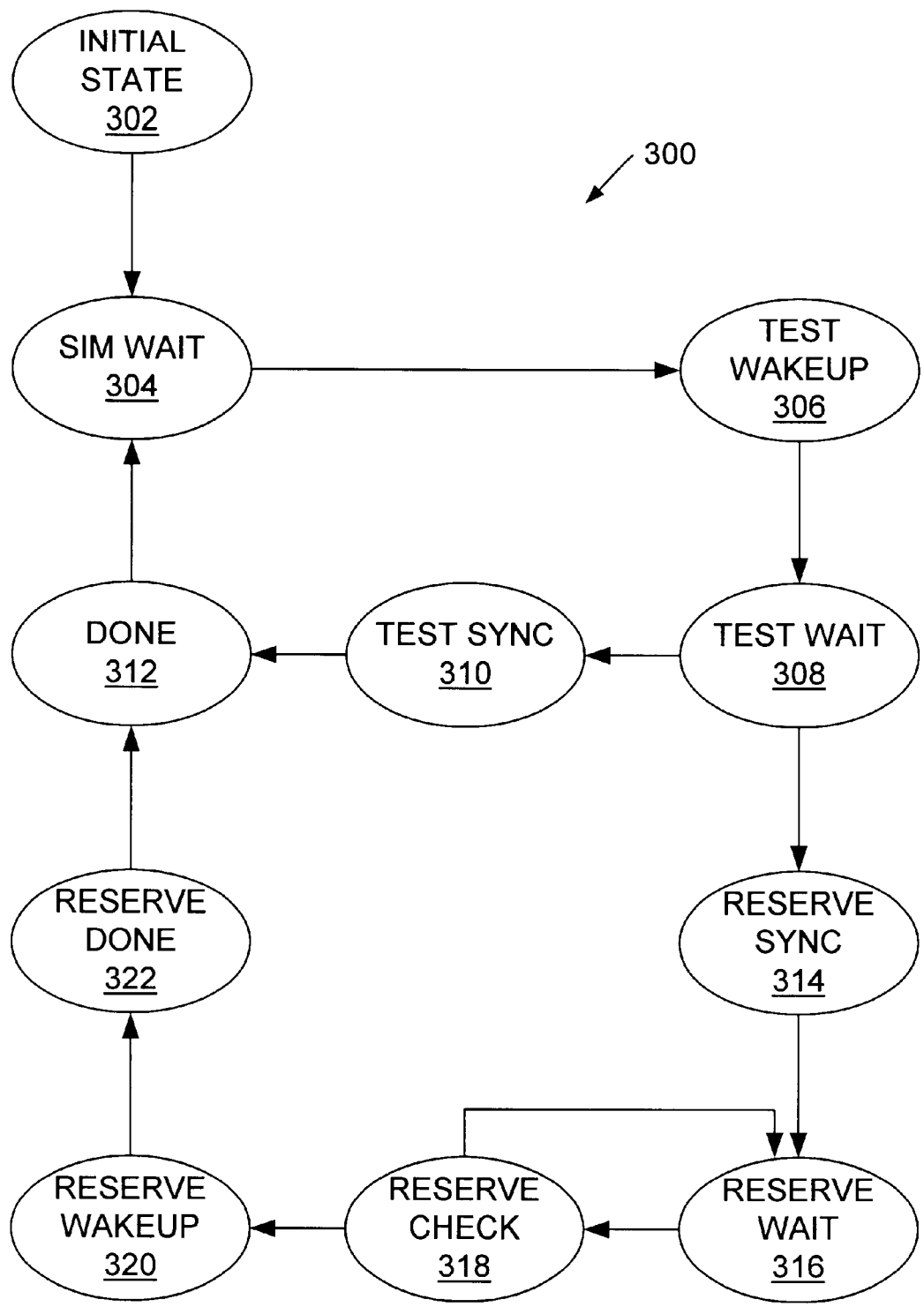
FIG. 3 is a state flow diagram illustrating states and state transitions of the local synchronization threads of FIG. 2.

LST 208B controls the state of test 120B in the manner illustrated in state diagram 300 (FIG. 3). When LST 208B (FIG. 2) is created, i.e., when test 120B registers with hub 130, LST 208B is in initial state 302 (FIG. 3). LST 208B immediately transfers to simulation wait state 304. Processing of LST 208B in simulation wait state 304 is illustrated by logic flow diagram 400 (FIG. 4A) in which processing begins in step 402.

Figure 6:
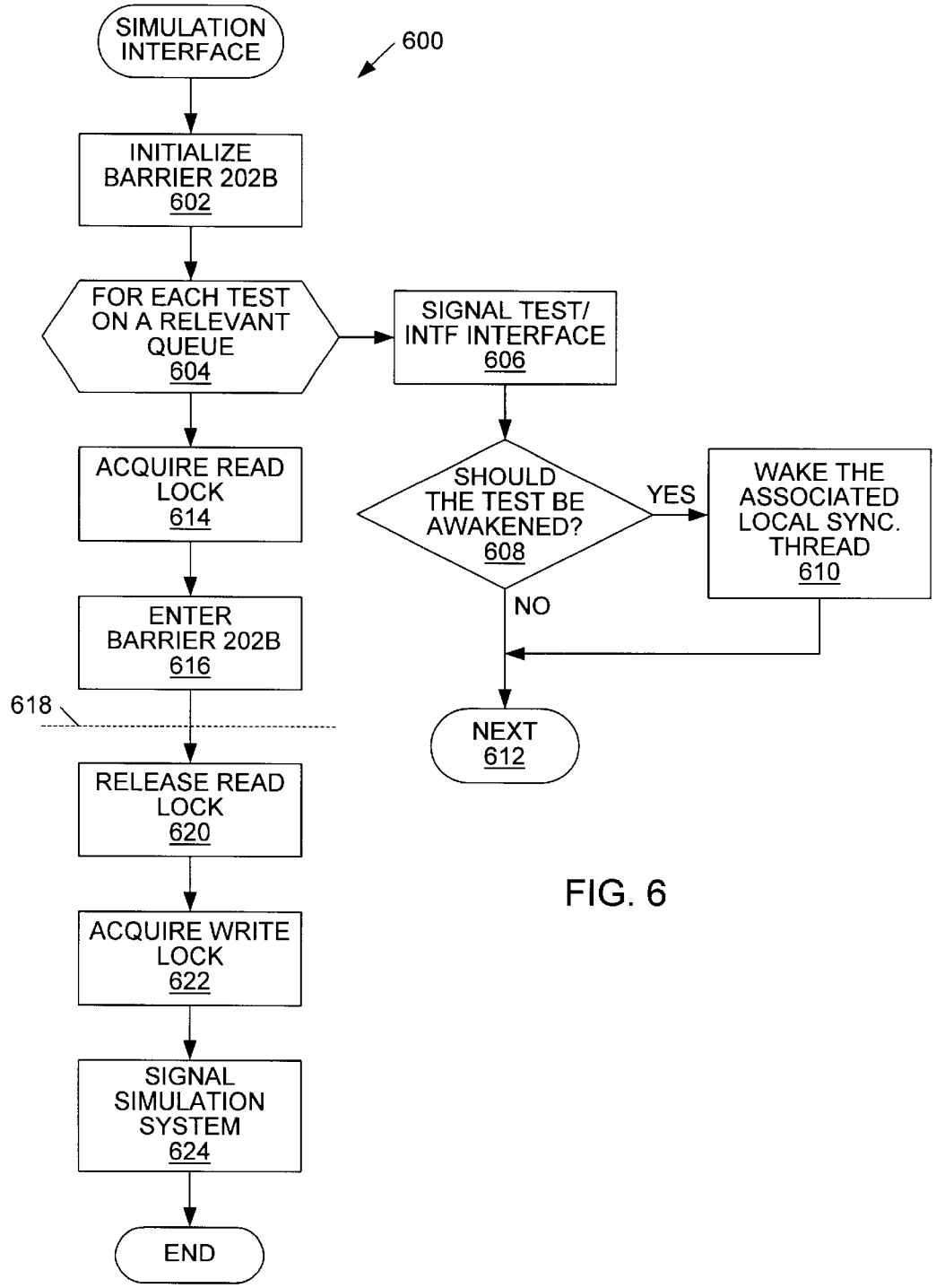
FIG. 6 is a logic flow diagram of the processing of the hub of FIG. 2.

In step 402, execution of LST 208B (FIG. 2) is suspended. In step 402 (FIG. 4A), execution LST 208B remains suspended until simulation system 140A generates an event, which is signaled to test 120B to indicate that execution of simulation system 140A is suspended and that test 120B can now initiate transactions with simulation system 140A. Simulation system 140A signals test 120B by sending to interface/simulation interface 206 a signaling message addressed to test 120B. Interface/simulation interface 206 coordinates the synchronization of tests signaled by simulation system 140A in a manner which is represented by logic flow diagram 600 FIG. 6). Interface/simulation interface 206 performs the steps of logic flow diagram 600 in response to an event message received from simulation system 140A. When interface/simulation interface 206 receives such an event message, processing begins in step 602 (FIG. 6).

Figure 5:
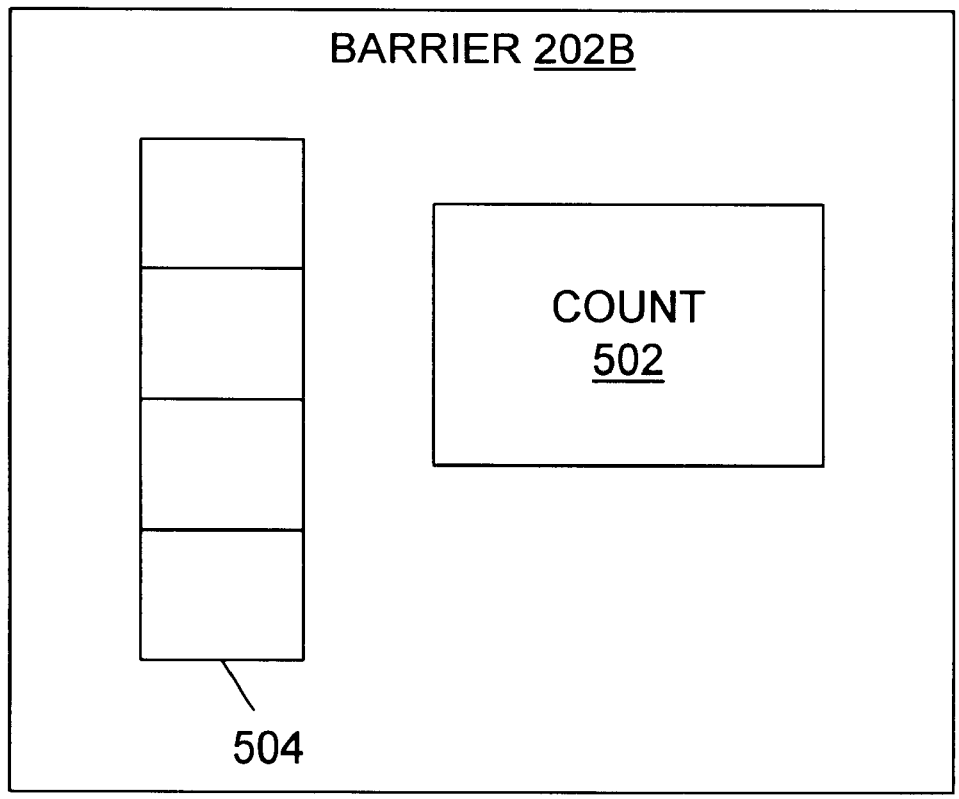
FIG. 5 is a block diagram of a barrier synchronization mechanism.

In step 602, interface/simulation interface 206 (FIG. 2) initializes a barrier 202B, which is described in greater detail below. Specifically, interface/simulation interface 206 stores in a count field 502 (FIG. 5) data representing the number of tests execution of which are resumed in response to the received event message. As used herein, a field is a collection of data which collectively define a particular piece of information. The number of tests is determined by interface/simulation interface 206 by determining the number of tests referenced by items of the relevant queues, which include a test queue of the destination of the event message, an event queue corresponding to the event indicated by the event message, and a simulation queue. The destination test is the test to which the event message is directed by simulation system 140A and is test 120B in this illustrative example. Each of the relevant queues includes a number of items, each of which references a test which is registered with hub 130. From step 602, processing transfers to loop step 604.

Loop step 604, in conjunction with next step 612, defines a loop in which each test referenced by an item of a relevant queue is processed according to steps 606–610. For each iteration of the loop defined by loop step 604 and next step 612, the test processed is referred to as the subject test. For each test referenced by an item of a relevant queue, processing transfers from loop step 604 to step 606.

In step 606, interface/simulation interface 206 (FIG. 2) signals test/interface interface 242 with a message which includes data identifying the event of simulation system 140A which triggered event message received by interface/simulation interface 206. Since test/interface interface 242 and user thread 240 are separate threads of test 120B, execution of user thread 240 can remain suspended while test core 242 processes the signal received from interface/simulation interface 206. Test/interface interface 242 responds to the message from interface/simulation interface 206 with a return message which indicates whether test 120B is to be awakened, i.e., whether execution of user thread 240 of test 120B is to be resumed. In general, execution test 120B is to be resumed if test 120B is ready to perform transactions with simulation system 140A and is to remain suspended otherwise.

Processing by interface/simulation interface 206 transfers to decision step 608 (FIG. 6) in which interface/simulation interface 206 (FIG. 2) determines whether the return message indicates that execution of test 120B is to be resumed. If execution of test 120B (FIG. 2) is to be resumed, processing transfers from decision step 608 (FIG. 6) to step 610 in which interface/simulation interface 206 (FIG. 2) signals LST 208B thereby resume execution of LST 208B and cause processing of LST 208B to transfer from step 402 (FIG. 4A) to step 404 as indicated by arrow 406. Processing transfers from step 610 through next step 612 to loop step 604 in which the next test referenced by an item of a relevant queue in the manner described above. Conversely, if execution of test 120B (FIG. 2) is to remain suspended, processing transfers from decision step 608 (FIG. 6) directly through next step 612 to loop step 604 in which the next test referenced by an item of a relevant queue in the manner described above, bypassing step 610. Accordingly, LST 208B (FIG. 2) is not signaled and therefore remains in simulation wait state 304 (FIG. 3).

Once each of the tests referenced by an item of a relevant queue is processed according to the loop defined by loop step 604 and next step 612, processing transfers from loop step 604 to step 614. In step 614, interface/simulation interface 206 (FIG. 2) acquires a hold lock on simulation system 140A to ensure proper synchronization as described more completely below. From step 614 (FIG. 6), processing transfers to step 616 in which simulation interface 206 (FIG. 2) enters barrier 202B. As described more completely below, barrier 202B holds a number of threads until all expected threads have entered barrier 202B and then allows all threads in barrier 202B to resume execution substantially simultaneously. Thus, the function of barrier 202B is analogous to the function of a starting gate in a horse race. Therefore, simulation interface 206 remains in barrier 202B until all expected LSTs enter barrier 202B as described more completely below.

As described above, processing of LST 208B transfers from step 402 (FIG. 4A) to step 404 in response to a signal received from interface/simulation interface 206 (FIG. 2) in step 610 (FIG. 6). In step 404 (FIG. 4A), LST 208B (FIG. 2) transfers from simulation wait state 304 (FIG. 3) to test wakeup state 306 in which LST 208B proceeds to awaken test 120B in the manner illustrated in logic flow diagram 410 (FIG. 4B) in which processing begins in step 412.

In step 412, LST 208B (FIG. 2) acquires a hold lock on simulation system 140A to ensure proper synchronization as described more completely below. Processing transfers from step 412 (FIG. 4B) to step 414 in which LST 208B signals test/interface interface 242 of test 120B by sending to test/interface interface 242 a signal message to thereby awaken test 120B. Signal messages are described more completely in the Interface Application and that description is incorporated herein by reference. In response to the signal message received from LST 208B, test/interface interface 242 invokes a signal call back function implemented in user thread 240 by a test designer engineer. In general, the signal call back function awakens test 120B, i.e., resumes execution of user thread 240. Once processing of user thread 240 resumes, test 120B and, in particular, user thread 240 can initiate transactions with simulation system 140A by accessing mailboxes (not shown) of simulation system 140A. Mailboxes and interaction between tests such as test 120B and simulation systems such as simulation system 140A using mailboxes are described more completely in the Interface Application and that description is incorporated herein by reference.

Figures 4A, 4B, 4C:
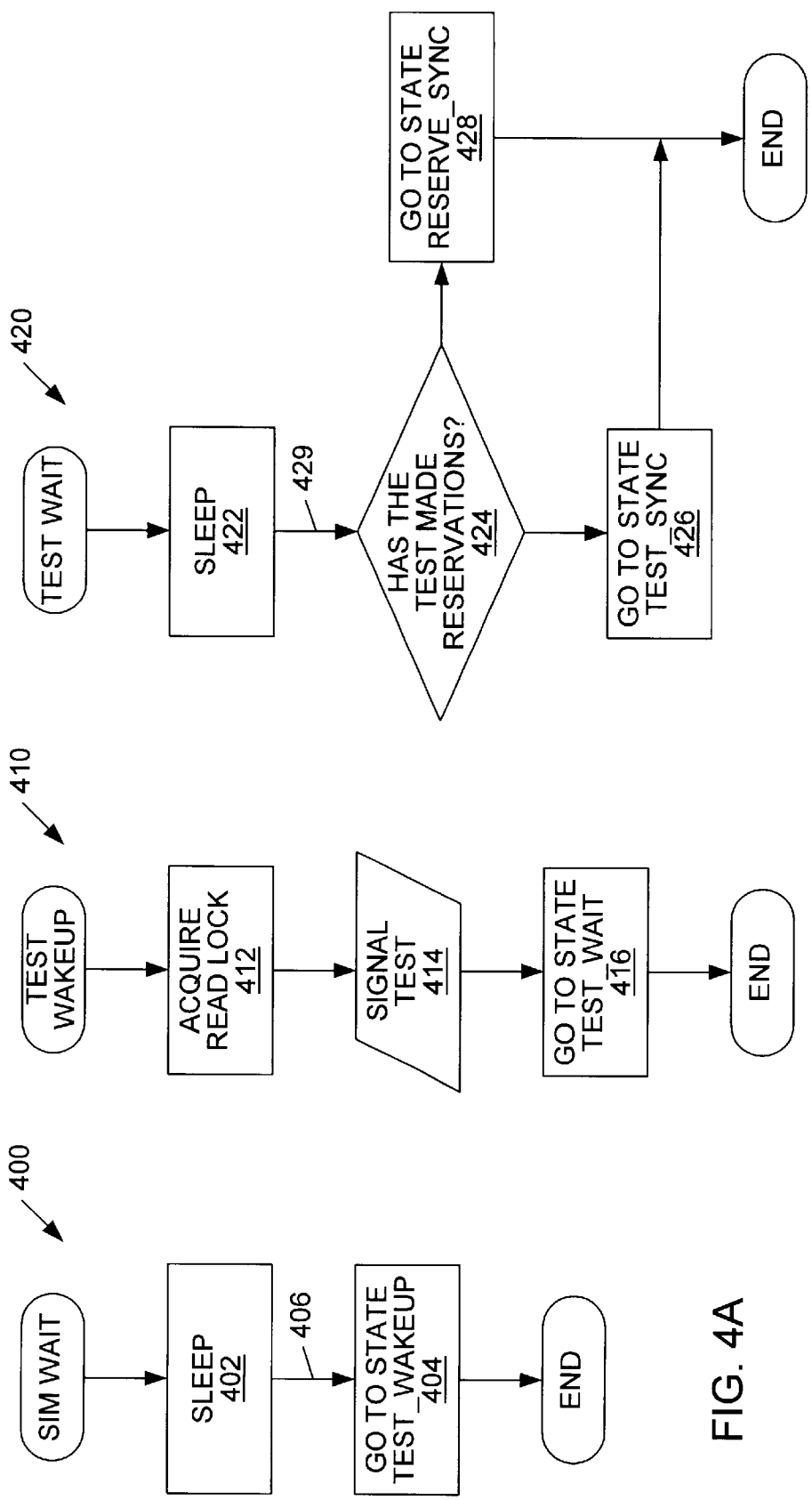

Processing of LST 208B transfers from step 414 (FIG. 4B) to step 416 in which LST 208B (FIG. 2) transfers to test wait state 308 (FIG. 3). In test wait state 308, LST 208B waits for test 120B to complete interaction with simulation system 140A, at which point test 120B signals LST 208B. Processing by LST 208B while in test wait state 308 (FIG. 3) is shown as logic flow diagram 420 (FIG. 4C) in which processing begins in step 422. In step 422, execution of LST 208B (FIG. 2) is suspended until LST 208B is signaled by test 120B as represented by arrow 429. When test 120B completes interaction with simulation system 140A, in accordance with the particular design of user thread 240 as implemented by a test design engineer, and signals LST 208B, processing by LST 208B transfers to decision step 424 (FIG. 4B).

In decision step 424, LST 208B (FIG. 2) determines whether test 120B has requested reservation of one or more devices of simulation system 140A. Requesting of reservations of devices of a simulation system such as simulation system 140A is described more completely in the Reservation Application and that description is incorporated herein by reference. Since LST 208B is a thread of hub 130 and therefore has access to the address space of memory 104 (FIG. 1) allocated to and used by hub 130 and, since all device reservations are requested of hub 130, LST 208B (FIG. 2) has access to information in hub 130 regarding which tests have reserved one or more devices. If test 120B has reserved one or more devices, processing by LST 208B transfers from decision step 424 (FIG. 4C) to step 428 in which LST 208B (FIG. 2) transfers to reserve synchronization state 314 (FIG. 3) which is described more completely below. Conversely, if test 120B (FIG. 2) has not reserved a device, processing by LST 208B transfers from decision step 424 (FIG. 4C) to step 426 in which LST 208B (FIG. 2) transfers to test synchronization state 310 (FIG. 3).

In test synchronization state 310, LST 208B (FIG. 2) waits for all active LSTs, e.g., LSTs 208A and 208C, to enter either test synchronization state 310 (FIG. 3) or reserve synchronization state to be sure that all tests which interact with simulation system 140A through hub 130 in the current cycle of state diagram 300 have completed whatever transactions such tests are configured to perform, i.e., that all active LSTs have passed through test wait state 308. As described more completely below, when all interaction between simulation system 140A and the tests which interact with simulation system 140A through hub 130 are completed, execution of simulation system 140A resumes. Processing by LST 208B in test synchronization state 310 (FIG. 3) is shown as logic flow diagram 430 (FIG. 4D) in which processing begins in step 432.

In step 432, LST 208B (FIG. 2) enters barrier 202B of hub 130. Barrier 202B is a mechanism by which hub 130 ensures that no thread of a group of one or more threads which enters barrier 202B is awakened until all threads of the group have entered barrier 202B. Threads of the group are sometimes referred to as expected threads in the context of barrier 202B. Barrier 202B is shown in greater detail in FIG. 5 and includes a count field 502 and a thread list 504. As described above with respect to step 602, interface/simulation interface 206 initializes barrier 202B by storing in count field 502 (FIG. 5) data representing the number of threads which must pass through barrier 202B. The number of threads which must pass through barrier 202B is the number of tests referenced by an item of a relevant queue as described in the context of logic flow diagram 600 plus one since interface/simulation interface 206 must also pass through barrier 202B.

As each LST enters barrier 202B (FIG. 5), the value represented in count field 502 is decremented. Similarly, when simulation interface 206 (FIG. 2) enters barrier 202B in step 616 (FIG. 6) as described above, the value represented in count field 502 is decremented. As described above, LSTs 208A–C and interface/simulation interface 206 are all threads of hub 130 and therefore have access to the address space of hub 130 and, accordingly, barrier 202B. After decrementing the value represented in count field 502 (FIG. 5), a thread entering barrier 202B compares the value represented by count field 502 to a value of zero. If the value represented by count field 502 is greater than zero, the thread places a reference to itself on thread list 504 and execution of the thread is suspended. A reference to a thread is data which uniquely identifies the thread. If, on the other hand, the value represented by count field 502 is greater than zero, the thread signals all threads referenced by an item of thread list 504. Thus, when any but the last of the expected threads enters barrier 202B, count field 202B is updated and the thread suspends execution. In addition, when the last expected thread of barrier 202B enters barrier 202B, execution of all threads which have previously entered barrier 202B is resumed. Thus, when interface/simulation interface 206 (FIG. 2) and each LST corresponding to a test which interacts with simulation system 140A enters barrier 202B, execution of each such thread is suspended and is resumed when simulation interface 206 and all such LSTs have entered barrier 202B.

When LST 208B is awakened from barrier 202B as represented by arrow 436 (FIG. 4D), processing by LST 208B (FIG. 2) transfers to step 434 (FIG. 4D) in which LST 208B (FIG. 2) transfers to done state 312 (FIG. 3). Processing by LST 208B (FIG. 2) in done state 312 (FIG. 3) is shown in logic flow diagram 440 (FIG. 4E) in which processing begins in step 442. In step 442, LST 208B (FIG. 2) releases the hold lock of simulation system 140A acquired in step 412 (FIG. 4B) to allow execution of simulator system 140A to resume as described more completely below. Processing transfers from step 442 (FIG. 4E) to step 444 in which LST 208B (FIG. 2) transfers to simulation wait state 304 (FIG. 3) which is described above and in which LST 208B (FIG. 2) waits until simulation interface 206 signals LST 208B in a subsequent cycle of state diagram 300 (FIG. 3).

As described above with respect to decision step 424 (FIG. 4C) and step 428, LST 208B (FIG. 2) transfers to reservation synchronization state 314 (FIG. 3) if test 120B has reserved one or more devices. Processing by LST 208B (FIG. 2) in reservation synchronization state 314 (FIG. 3) is shown in logic flow diagram 450 (FIG. 4F) in which processing begins in step 452. In step 452, LST 208B (FIG. 2) enters barrier 202B. Step 452 (FIG. 4F) is directly analogous to step 432 (FIG. 4D) which is described above. When execution of LST 208B (FIG. 2) resumes upon leaving barrier 202D as represented by arrow 458 (FIG. 4F), processing by LST 208B (FIG. 2) transfers to step 454 (FIG. 4F) in which LST 208B (FIG. 2) releases the hold lock of simulation system 140A acquired in step 412 (FIG. 4B) to thereby allow execution of simulation system 140A to resume as described more completely below. Processing transfers from step 454 (FIG. 4F) to step 456 in which LST 208B (FIG. 2) transfers to reservation wait state 316 (FIG. 3).

In reservation wait state 316 (FIG. 3), execution of LST 208B is suspended while reservation requests of test 120B are processed by hub 130. Processing by LST 208B in reservation wait state 316 FIG. 3) is shown in logic flow diagram 460 (FIG. 4G) in which processing begins in step 462. In step 462, execution of LST 208B (FIG. 2) is suspended while hub 130 processes reservation requests transmitted to interface/simulation interface 206 by test 120B. When hub 130 grants all pending reservation requests of all requesting tests which can simultaneously be granted, hub 130 signals all LSTs in reservation wait state 316 FIG. 3), including LST 208B, as represented by arrow 466 (FIG. 4G) to resume execution of LST 208B (FIG. 2) and all LSTs in reservation wait state 316 (FIG. 3). Substantially immediately prior to signaling each LST in reservation wait state 316, hub 130 acquires on behalf of each LST a hold lock on simulation system 140A to prevent resumption of execution of simulation system 140A since the test corresponding to each LST can initiate transaction with simulation system 140A once all reservation requests of the test have been granted. Processing of reservation requests by hub 130, and the order in which such requests are served, are described more completely in the Reservation Application. When execution of LST 208B is resumed by the signal, LST 208B transfers to reservation check state 318 (FIG. 3) in step 464 (FIG. 4G).

In reservation check state 318 (FIG. 3), LST 208B (FIG. 2) verifies that all reservation requests of test 120B have been granted. Processing by LST 208B in reservation check state 318 (FIG. 3) is shown in logic flow diagram 470 (FIG. 4H) in which processing begins in decision step 472. In decision step 472, LST 208B (FIG. 2) determines whether all reservation requests of test 120B have been granted. Since LST 208B is a thread of hub 130 and hub 130 processes reservation requests as described more completely in the Reservation Application, LST 208B has access to information within hub 130 which specifies which reservation requests have been granted and/or which reservation requests are pending.

If one or more reservation requests of test 120B have not been granted and are therefore pending, processing transfers from decision step 472 (FIG. 4H) to step 476 in which LST 208B (FIG. 2) releases the hold lock on simulation system 140A acquired in step 412 (FIG. 4B) to allow execution of simulation system 140A to resume. If not all reservation requests of test 120B have been granted, test 120B cannot initiate transactions with simulator system 140A and LST 208B therefore permits execution of simulator system 140A to resume. Processing transfers from step 476 (FIG. 4H) to step 478 in which LST 208B (FIG. 2) transfers to reservation wait state 316 (FIG. 3) which is described above and in which LST 208B (FIG. 2) waits to be signaled by hub 130 that all reservation requests of test 120B are granted. Conversely, if all reservation requests of test 120B are granted and therefore no such requests are pending, processing transfers from decision step 472 (FIG. 4H) to step 474. In step 474, LST 208B (FIG. 2) transfers to reservation wakeup state 320 (FIG. 3).

In reservation wakeup state 320, LST 208 (FIG. 2) signals test core 242 to cause execution of user thread 240 of test 120B to continue. As described above, hub 130 acquires on behalf of LST 208B a hold lock on simulator system 140A. Accordingly, execution of simulation system 208B will not resume while execution of user thread 240 of test 120B continues. Since all reservation requests of test 120B are determined to have been granted, test 120B can now interact with simulation system 140A through mailboxes (not shown) of simulation system 140A as described more completely in the Interface Application. Processing of LST 208B in reservation wakeup state 320 (FIG. 3) is shown in logic flow diagram 480 (FIG. 4I) in which processing begins in step 482. In step 482, LST 208B (FIG. 2) signals test/ interface interface 242 to cause execution of user thread 240 of test 120B to continue. Processing transfers from step 482 (FIG. 4I) to step 484 in which LST 208B (FIG. 2) transfers to reservation done state 322 (FIG. 3).

In reservation done state 322, LST 208B (FIG. 2) waits for interaction between test 120B and simulation system 140A to complete. Processing by LST 208B in reservation done state 322 (FIG. 3) is shown as logic flow diagram 490 (FIG. 4J) in which processing begins in step 492. In step 492, LST 208B (FIG. 2) sleeps while test 120B interacts with simulation system 140A. When test 120B completes interaction with simulation system 140A, test 120B signals LST 208B as represented by arrow 494 (FIG. 4J) to cause execution of LST 208B (FIG. 2) to be resumed. The specific interaction between test 120B and simulation system 140A and completion of the interaction are determined by the particular design and configuration of test 120B as selected by a test design engineer who configures test 120B. When execution of LST 208B is resumed by the signal, LST 208B transfers, in step 496 (FIG. 4J), to done state 312 (FIG. 3) which is described above and from which a subsequent cycle of state diagram 300 is performed by LST 208B.

In step 442 (FIG. 4E), LST 208B (FIG. 2) releases the hold lock of simulation system 140A acquired in step 412 (FIG. 4B) to thereby allow execution of simulation system 140A to resume. Each test which interacts with simulation system 140A in the manner described above with respect to test 120B similarly releases previously acquired hold locks of simulation system 140A corresponding LSTs enter done state 312 (FIG. 3). By releasing such a hold lock in step 442 (FIG. 4E), LST 208B indicates that test 120B has completed all interaction with simulation system 140A and LST 208B grants simulation system 140A permission to resume execution.

As described above, when all expected threads, including interface/simulation interface 206, have entered barrier 202B, all such expected threads are signaled and in response thereto resume execution. When simulation interface 206 is awakened, processing of simulation interface 206 continues with step 620 (FIG. 6). In step 620, simulation interface 206 (FIG. 2) releases the hold lock on simulation system 140A acquired in step 614 (FIG. 6) as described above. Processing transfers from step 620 (FIG. 6) to step 622 in which interface/simulation interface 206 (FIG. 2) acquires, and substantially immediately thereafter releases, a start lock on simulation system 140A to ensure all LSTs have left barrier 202B.

Any number of threads can acquire a hold lock on a simulation system such as simulation system 104A so long as no thread has a start lock on the simulation system. Execution of a thread attempting to acquire a hold lock on a simulation system, when another thread has a start lock on the same simulation system or when a request for a start lock on the simulation system is pending, is suspended and resumes when the previously requested or acquired start lock is released. At most one thread can acquire a start lock on a simulation system such as simulation system 104A and only when no thread has a hold lock on the simulation system. Execution of a thread attempting to acquire a start lock on a simulation system, when one or more other threads each have a hold lock on the same simulation system or when one or more requests for hold locks on the simulation system are pending, is suspended and resumes when all previously requested or acquired hold locks are released. Hold locks and start locks are described more completely in the Interface Application and that description is incorporated herein by reference.

Thus, by acquiring a start lock on simulation system 140A in step 622 (FIG. 6), simulation interface 206 (FIG. 2) ensures that no LST has a hold lock on simulation system 140A, and that every LST has successfully left barrier 202B and resumed execution, prior to transferring processing to step 624 (FIG. 6) in which simulation interface 206 (FIG. 2) signals simulation system 140A to resume execution. Conversely, by acquiring a hold lock on simulation system 140A, e.g., in step 412 (FIG. 4B), LST 208B prevents simulation interface from signaling simulation system 140A in step 624 (FIG. 6) while test 120B (FIG. 2) interacts with simulation system 140A. After step 624 (FIG. 6), processing according to logic flow diagram 600 completes.

Synchronization of Multiple Simulation Systems

As described above, each of simulation systems 140A–C (FIG. 1) and tests 120A–C and each of other simulation systems and tests executing in computers 100B–C and interacting though hub 130 are allowed to reach a common point in simulation time. To accomplish this, each simulation system is configured generate a synchronization event at specific simulation times and to send to interface/simulation interface 206 (FIG. 2) a message specifying the synchronization event. For example, each and every simulation system registered with hub 130 can be configured to generate, and send a message representing, a synchronization event at simulation times 100, 200, 300, etc. The specific, predetermined simulation times at which synchronization events are generated by each and every simulation system registered with hub 130 are sometimes referred to as global synchronization times.

At each global synchronization time, hub 130 synchronizes execution of the simulation systems, e.g., simulation systems 140A–C, by processing each synchronization event specified in a message received by interface/simulation interface 206. Interface/simulation interface 206 (FIG. 2) determines whether the simulation system generating the synchronization event, which is sometimes referred to as the event generating simulation system, is the last of the simulation systems registered with hub 130 to do so. Interface/simulation interface 206 can make such a determination by comparing the number of simulation systems to generate a synchronization event corresponding to a particular global synchronization time to the number of simulation systems registered with hub 130. If the event generating simulation system is not the last simulation system to generate a synchronization event corresponding to a particular synchronization time, interface/simulation interface 206 (FIG. 2) places on a synchronization queue 206Q data representing the event. In one embodiment, interface/simulation interface 206 places on synchronization queue 206Q data specifying the event generating simulation system.

Execution of the event generating simulation system, e.g., simulation system 140A (FIG. 2), is suspended by operation of the RPC communications protocol implemented by interface/simulation interface 206 and simulation/interface interface 262. The RPC communication protocol is described more completely in the Interface Application and that description is incorporated herein by reference. Briefly, simulation system 140A sends a message to interface/simulation interface 206 indicating that a synchronization event has occurred, and the message is in the form of a remote procedure call, i.e., an RPC, to interface/simulation interface 206. Execution of simulation system 140A is suspended until a return message from interface/simulation interface 206 to simulation system 140A indicates that the called remote procedure, i.e., the task to be performed by interface/simulation interface 206 in response to the RPC, has been successfully performed. Since no return message is sent to interface/simulation interface 262, execution of simulation system 140A remains suspended.

If simulation/interface interface 206 (FIG. 2) determines that the event generating simulation system is the last to generate a synchronization event for a particular global synchronization time, each synchronization event represented on synchronization queue 206Q (FIG. 2) is processed as follows. Interface/simulation interface 206 (FIG. 2) enters a barrier, e.g., barrier 202B, for the particular simulation system which generated the particular synchronization event. Specifically, interface/simulation interface 206 (FIG. 2) performs steps 616–624 (FIG. 6) in the context of the simulation system which generated the particular synchronization event. When each synchronization event represented on synchronization queue 206Q (FIG. 2) has been processed, interface/simulation interface 206 enters a barrier, e.g., barrier 202B, for the event generating simulation system. As described above, interface/simulation interface 206 (FIG. 2) signals a simulation system to resume execution in step 624 (FIG. 6). In particular, the signal sent to the simulation system in step 624 is a return message indicating successful completion of the particular task invoked by the remote procedure call. Thus, step 616 (FIG. 6) is performed by interface/simulation interface 206 for each of the simulation systems registered with hub 130 substantially simultaneously. Therefore, line 618 (FIG. 6) represents a global synchronization point at which every simulation system registered with hub 130 is synchronized. In addition, since every test interacting with each simulation system is synchronized in a barrier such as barrier 202B (FIG. 2), every test registered with hub 130 is also synchronized at line 618.

Thus, in accordance with the present invention, a simulation which is distributed among multiple simulation systems, which are accessed substantially simultaneously by multiple tests, is efficiently and effectively synchronized at designated simulation times. In addition, since synchronization of each of the tests is controlled by a separate thread, the synchronization state and synchronization state transitions of a single test can easily be isolated, examined, and analyzed using conventional debuggers.

The above description is illustrative only and is not limiting. The present invention is limited only by the claims which follow.

What is claimed is:

1. A method for controlling execution of a plurality of concurrently executing tests of a distributed simulation which includes a simulation control hub, the method comprising:

creating a first agent in the hub in response to detecting registration of a first test, wherein the first agent corresponds to the first test;

creating a second agent in the hub in response to detecting registration of a second test, wherein the second agent corresponds to the second test;

determining the first test has arrived at a predetermined simulation time;

suspending execution of the first test until the second test has arrived at the predetermined simulation time; and resuming execution of the first test concurrently with the second test in response to detecting said first and second tests have arrived at the predetermined simulation time.

2. The method of claim 1 wherein suspending execution comprises:

receiving, in the hub, a request from the first test; and withholding a response to the request.

3. The method of claim 2 wherein resuming execution comprises providing the response to the request.

4. The method of claim 1, wherein the first and second agents comprise separately executable threads, and wherein an execution state of the first test is represented by the first agent and an execution state of the second test is represented by the second agent; further wherein suspending execution comprises suspending execution of the first agent.

5. The method of claim 4 wherein resuming execution comprises resuming execution of the first agent.

6. A computer program product comprising:

a computer usable medium having computer readable code embodied therein for controlling execution of a plurality of concurrently executing tests of a distributed simulation which includes a simulation control hub, the computer readable code comprising:

code for creating a first agent in the hub in response to detecting registration of a first test, wherein the first agent corresponds to the first test;

code for creating a second agent in the hub in response to detecting registration of a second test, wherein the second agent corresponds to the second test;

code for determining the first test has arrived at a predetermined simulation time;

code for suspending execution of the first test until the second test has arrived at the predetermined simulation time; and code for resuming execution of the first test concurrently with the second test in response to detecting said first and second tests have arrived at the predetermined simulation time.

7. The computer program product of claim 6 wherein suspending execution comprises:

receiving, in the hub, a request from the first test; and withholding a response to the request.

8. The computer program product of claim 7 wherein resuming execution comprises providing the response to request.

9. The computer program product of claim 6 wherein the first and second agents comprise separately executable threads, and wherein an execution state of the first test is represented by the first agent and an execution state of the second test is represented by the second agent; further wherein suspending execution comprises suspending execution of the first agent.

10. The computer program product of claim 9 wherein resuming execution comprises resuming execution of the first agent.

11. A computer system for controlling a plurality of concurrently executing tests, said system comprising:

a plurality of computing devices, wherein each of said devices are configured to execute a test of a distributed simulation which includes one or more circuit simulations; and a hub configured to allow each of said tests to interact with each of said circuit simulations, wherein said hub is configured to:

create a first agent in response to detecting registration of a first test, wherein the first agent corresponds to the first test;

create a second agent in response to detecting registration of a second test, wherein the second agent corresponds to the second test;

determine the first test has arrived at the predetermined simulation time;

suspend execution of the first test until the second test has arrived at the predetermined simulation time; and resume execution of the first test concurrently with the second test in response to detecting the first and second tests have arrived at the predetermined simulation time.

12. The computer system of claim 11 wherein said hub is configured to suspend said execution by:

receiving, in the hub, a request from the first test; and withholding a response to the request.

13. The computer system of claim 12 wherein said hub is configured to resume said execution by providing the response to the request.

14. The computer system of claim 11 wherein the first and second agents comprise separately executable threads, and wherein an execution state of each of the first test is represented by the first agent and an execution state of the second test is represented by the second agent, and wherein said hub is configured to suspend said execution by suspending execution of the first agent.

15. The computer system of claim 14 wherein said hub is configured to resume said execution by resuming execution of the first agent.

* * * * *